US010102050B2

(12) United States Patent
Kris et al.

(10) Patent No.: US 10,102,050 B2
(45) Date of Patent: Oct. 16, 2018

(54) SYSTEM AND METHOD FOR GENERATING CROSS-CORE BREAKPOINTS IN A MULTI-CORE MICROCONTROLLER

(71) Applicant: Microchip Technology Incorporated, Chandler, AZ (US)

(72) Inventors: Bryan Kris, Gilbert, AZ (US); Mike Catherwood, Georgetown, TX (US); Dave Mickey, Chandler, AZ (US); Brian Fall, Mesa, AZ (US); Calum Wilkie, Chandler, AZ (US); Vincent Sheard, Tempe, AZ (US); Alex Dumais, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 115 days.

(21) Appl. No.: 15/012,287

(22) Filed: Feb. 1, 2016

(65) Prior Publication Data
US 2016/0231376 A1 Aug. 11, 2016

Related U.S. Application Data

(60) Provisional application No. 62/112,552, filed on Feb. 5, 2015.

(51) Int. Cl.
G06F 11/07 (2006.01)
G06F 11/22 (2006.01)
G01R 31/28 (2006.01)
G06F 11/36 (2006.01)
G01R 31/3177 (2006.01)

(52) U.S. Cl.
CPC ...... *G06F 11/0772* (2013.01); *G01R 31/2851* (2013.01); *G06F 11/2231* (2013.01); *G01R 31/3177* (2013.01); *G06F 11/3648* (2013.01); *G06F 11/3652* (2013.01)

(58) Field of Classification Search
CPC ............ G06F 11/0772; G06F 11/2231; G06F 11/3648; G06F 11/3652; G05B 2219/23283; G01R 31/2851; G01R 31/3177
See application file for complete search history.

(56) References Cited

U.S. PATENT DOCUMENTS 5,640,542 A * 6/1997 Whitsel ............... G06F 11/3648
703/28
6,205,560 B1 * 3/2001 Hervin ................ G06F 11/2236
712/227

(Continued)

OTHER PUBLICATIONS

Park, H., Xu, J. Z., Kim, K. H., & Park, J. S. (2012). On-Chip Debug Architecture for Multicore Processor. ETRI Journal, 34(1), 44-54.*

(Continued)

Primary Examiner — Paul Contino
(74) Attorney, Agent, or Firm — Slayden Grubert Beard PLLC

(57) ABSTRACT

In a debugging method for an integrated circuit device which has multiple processing cores, a debugging breakpoint is activated at a first processor core in the integrated circuit device. Upon activation, the debugging breakpoint stops execution of instructions in the first processor core and the debugging breakpoint is communicated to a second processor core in the integrated circuit device.

15 Claims, 7 Drawing Sheets

(56) References Cited

U.S. PATENT DOCUMENTS

| | | | |
|---|---|---|---|
| 6,598,178 B1* | 7/2003 | Yee | G06F 11/3632 714/34 |
| 7,228,264 B2* | 6/2007 | Barrenscheen | G06F 11/261 703/23 |
| 2002/0162051 A1* | 10/2002 | Bolding | G06F 11/073 714/20 |
| 2003/0014736 A1 | 1/2003 | Nguyen et al. | 717/129 |
| 2004/0019827 A1* | 1/2004 | Rohfleisch | G01R 31/31705 714/29 |
| 2006/0282707 A1* | 12/2006 | Rosenbluth | G06F 11/3648 714/38.14 |
| 2007/0180322 A1 | 8/2007 | Todoroki et al. | 714/34 |
| 2007/0226740 A1* | 9/2007 | Li | G06F 11/3632 718/102 |
| 2009/0055676 A1* | 2/2009 | Wiebe | G06F 1/06 713/501 |
| 2009/0113211 A1* | 4/2009 | Liu | H04L 9/00 713/189 |
| 2010/0049956 A1* | 2/2010 | Moyer | G06F 9/3005 712/227 |
| 2010/0095154 A1* | 4/2010 | Shih | G06F 11/3648 714/30 |
| 2011/0173477 A1* | 7/2011 | Asaba | G06F 1/3203 713/323 |
| 2011/0179309 A1* | 7/2011 | Pathirane | G06F 11/3648 714/37 |
| 2011/0231827 A1* | 9/2011 | Kilbane | G06F 11/362 717/129 |
| 2012/0226839 A1* | 9/2012 | Fuoco | G06F 11/3636 710/110 |
| 2013/0111270 A1 | 5/2013 | Kimura et al. | 714/37 |
| 2018/0113796 A1* | 4/2018 | Meyers | G06F 11/3664 |

OTHER PUBLICATIONS

Vermeulen, Bart, and Sjaak Bakker. "Debug architecture for the En-II system chip." IET Computers & Digital Techniques 1.6 (2007): 678-684.*

Xu, Jing-Zhe, et al. "Easily Adaptable On-Chip Debug Architecture for Multicore Processors." ETRI Journal 35.2 (2013): 301-310.*

International Search Report and Written Opinion, Application No. PCT/US2016/016293, 10 pages, dated May 4, 2016.

* cited by examiner

SYSTEM AND METHOD FOR GENERATING CROSS-CORE BREAKPOINTS IN A MULTI-CORE MICROCONTROLLER

RELATED PATENT APPLICATION

This application claims priority to commonly owned U.S. Provisional Patent Application No. 62/112,552 filed Feb. 5, 2015, which is hereby incorporated by reference herein for all purposes.

TECHNICAL FIELD

The present disclosure relates to processors and, in particular, to systems and methods for generating cross-core breakpoints in an multi-core processor, in particular an asymmetric multi-core processor.

BACKGROUND

A processor breakpoint is a stopping place in a program, also known as a pause, put in place for debugging purposes. The processor breakpoint is typically triggered when a specific memory location is accessed. During the interruption, the memory, register, etc., environment is examined to determine whether the program is functioning as expected. The memory location can be in program memory and may comprise a specific instruction which when fetched by the processor may trigger the breakpoint and stop execution. These type of breakpoints may only need to compare the program counter with the respective memory address. However, the memory location may also be in data memory and either a write or read operation or both may trigger the breakpoint and stops further execution of instructions.

Most multi-processor devices use symmetrical processor cores. By definition, the cores are interchangeable, sharing memory, peripherals, and software tasks. The system software is allocated an available processor as it becomes free. Thus, a debugging is confined to a particular core. Accordingly, there is no need to determine what another core is doing at the same time.

In multi-processor devices with asymmetrical processor cores, however, the asymmetrical cores have differing memory and peripheral sets, may also operate at different speeds, and execute different software programs. In this case, a function of one processor can thereby affect another.

There is therefore a need to correlate a specific processor's breakpoint event with what the other processors are doing.

SUMMARY

As will be explained in greater detail below, embodiments provide for communicating processor breakpoints to other processor cores in a multi-core processing device. Embodiments may be particularly well-suited for use in a multi-core processing device.

According to an embodiment, a debugging method for an integrated circuit device comprising multiple processing cores, may comprise: activating a debugging breakpoint at a first processor core in the integrated circuit device, wherein the debugging breakpoint stops execution of instructions in the first processor core; and communicating the debugging breakpoint to a second processor core in the integrated circuit device.

According to a further embodiment, the method may further comprise setting one or more cross breakpoint enable bits in a break point register thereby enabling the step of communicating the debugging breakpoint. According to a further embodiment, communicating the debugging breakpoint may comprise asserting a breakpoint at the second processor core, wherein the breakpoint stops execution of instructions in the second processor core. According to a further embodiment, the method may further comprise setting one or more cross breakpoint interrupt enable bits in a break point register thereby enabling the step of communicating the debugging breakpoint. According to a further embodiment, communicating the debugging breakpoint may comprise asserting a breakpoint interrupt at an interrupt controller associated with the second processor core. According to a further embodiment, the second processor core may execute an interrupt service routine upon receiving said breakpoint interrupt. According to a further embodiment, the interrupt service routine may generate data related to the debugging breakpoint. According to a further embodiment, the data can be communicated to a host system. According to a further embodiment, the first processor core can be clocked by a first system clock and the second processor core is clocked by a second system clock which is different than the first system clock. According to a further embodiment, communicating the debugging breakpoint may comprise synchronizing the debugging breakpoint to the second system clock. According to a further embodiment, the debugging breakpoint can be generated from a plurality of programmable breakpoints. According to a further embodiment, said programmable breakpoints may comprise instruction breakpoints and data breakpoints. According to a further embodiment, the first processor core can be a master core and the second processor core can be a slave core. According to a further embodiment, the first processor core can be a slave core and the second processor core is a master core.

According to another embodiment, an integrated circuit device with a plurality of processor cores, comprising: a first processor core including first emulator logic for activating a first processor core breakpoint; a second processor core communicatively coupled to the first processor core and including second emulator logic; and a first cross breakpoint logic within the first emulator logic configured to communicate a breakpoint activated by the first emulator logic at the first processor core to the second processor core.

According to a further embodiment, the first cross breakpoint logic may communicate the breakpoint to the second emulator logic of the second processor core thereby stopping execution of instructions at the second processor core. According to a further embodiment, the integrated circuit device may further comprise a break point register comprising one or more cross breakpoint enable bits operable to enable the first cross breakpoint logic to communicate the breakpoint to the second emulator logic. According to a further embodiment, the second emulator logic may comprise a second cross breakpoint logic configured to communicate a breakpoint activated by the second emulator logic at the second processor core to the first processor core. According to a further embodiment, the cross breakpoint logic may communicate the breakpoint as an interrupt request to an interrupt input associated with the second processor core. According to a further embodiment, the integrated circuit device may further comprise a break point register comprising one or more cross breakpoint interrupt enable bits operable to enable the cross breakpoint logic to communicate the interrupt request to the interrupt input associated with the second processor core. According to a further embodiment, each emulator logic may comprise an interface coupled with a set of external pins. According to a further embodiment, a first set of peripheral devices can be integrated within the integrated circuit device and coupled with the first processor core thereby forming a first microcontroller and a second set of peripheral devices can be integrated within the integrated circuit device and coupled with the second processor core thereby forming a second microcontroller. According to a further embodiment, the first microcontroller can be operating as a master and the second microcontroller can be operating as a slave. According to a further embodiment, the first processor core can be clocked by a first system clock and the second processor core can be clocked by a second system clock which is different than the first system clock. According to a further embodiment, the integrated circuit device may further comprise clock crossing circuitry interfacing the cross breakpoint logic with the second processor core. According to a further embodiment, the clock crossing circuitry can be coupled between the cross breakpoint logic and an interrupt controller associated with the second processor core. According to a further embodiment, the first set of peripheral devices and/or the second set of peripheral devices may comprise a serial communication peripheral. According to a further embodiment, the first and/or second emulator logic can be operable to configure a plurality of programmable breakpoints. According to a further embodiment, said programmable breakpoints may comprise instruction breakpoints and data breakpoints.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features and wherein.

DETAILED DESCRIPTION

The disclosure and various features and advantageous details thereof are explained more fully with reference to the exemplary embodiments illustrated in the accompanying drawings and detailed in the following description.

Figure 1:
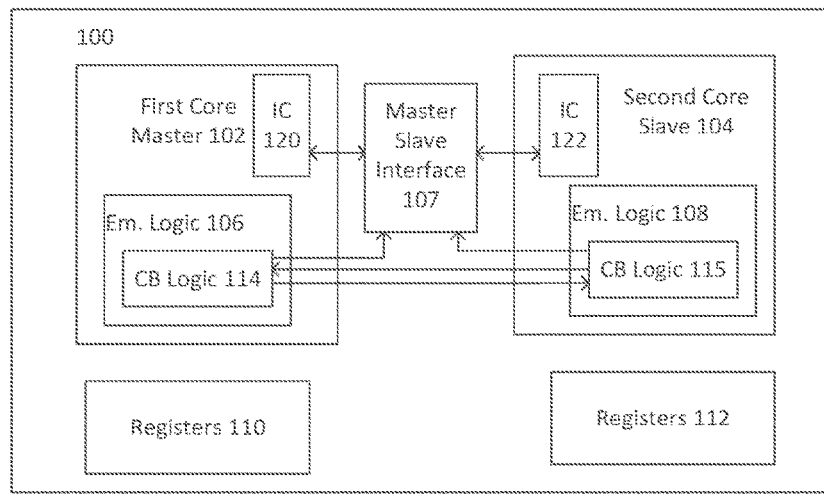
FIG. 1 is a diagram illustrating an exemplary multicore processing device in accordance with embodiments.

Turning now to the drawings and with particular attention to FIG. 1, a diagram illustrating an example asymmetric multicore processing device (i.e., microprocessor or microcontroller) in accordance with various embodiments is shown and generally identified by the reference numeral 100. In the context of the present application, the term "asymmetric" is used to describe that the two or more cores are operating independently. The processor cores may be identical but operate from different memories and in case of a microcontroller implementation with different peripheral devices. According to other embodiments, two different cores could be implemented or two identical cores that run with different system clocks may be implemented. However, the principles of the present application are not restricted to such implementations but may also be used in implementations with two identical cores that run with the same system clock but each core operates independent form the other core.

In the embodiment illustrated in FIG. 1, the processing device 100 may include a first core 102 and a second core 104. In some embodiments, the first core 102 may be, for example, a first microprocessor core (central processing unit) while the second core 104 may be a second microprocessor core or a DSP (digital signal processor). Other configurations of the two cores are possible. As will be explained in greater detail below, the first core 102 and the second core 104 may include or be communicatively coupled with emulator logic 106, 108 integrated within the cores, respectively. The emulator logic 106, 108 may further include cross break logic 114, 116, respectively, as will be explained in greater detail below. Each core 102 and 104 also comprises an interrupt controller 120 and 122, respectively. Finally, each core 102, 104 may be associated with a set of control and status registers 110, 112, respectively. Depending on the architecture of the cores, these registers may be either integrated within the cores or as shown in FIG. 1 arranged externally from the cores 102, 104. In particular, some embodiments provide status registers 110, 112 for propagating a breakpoint from one processor core to another as breakpoint requests and/or interrupt enable requests and for setting status bits indicating that a breakpoint has been received. In addition, in some embodiments, the processing device 100 may include a programmable interrupt controllers 120, 122 as mentioned above for asserting interrupts at each corresponding core. Furthermore, a master-Slave interface 107 is shown in FIG. 1 which provides for communication between the two cores 102 and 104. The shown configuration is exemplary only. Other configurations are possible. For example, some processing devices may employ more than two cores and associated control and status registry.

Figure 2:
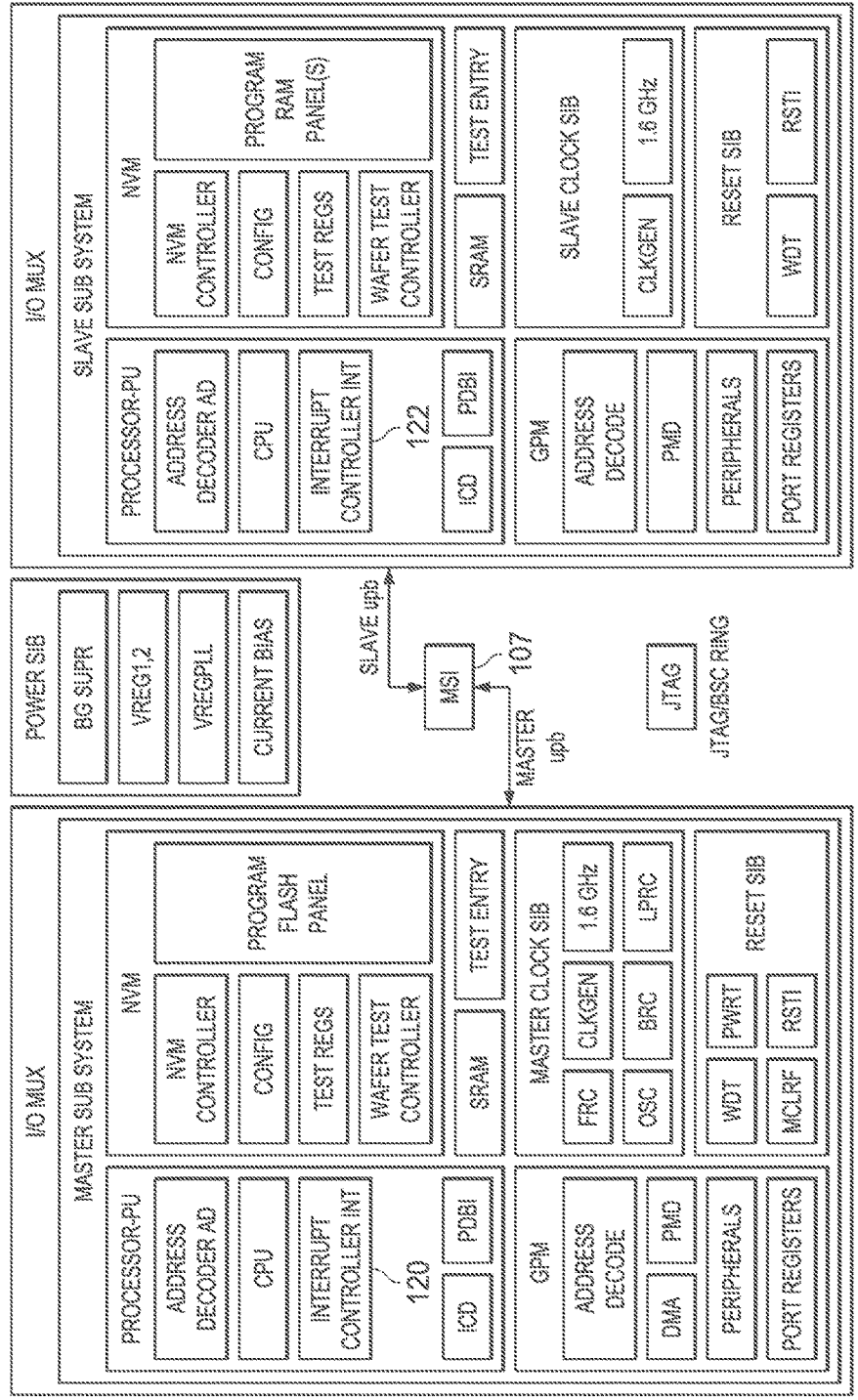
FIG. 2 is a diagram illustrating an exemplary breakpoint register in accordance with embodiments.

The two cores can be arranged in a Master/Slave Core configuration within an integrated circuit device 150 as shown in FIG. 2, for example, the first microprocessor core may be implemented as the master core whereas the second microprocessor or DSP core is implemented as the slave. Such a configuration allows the master to control certain functions The integrated circuit (IC) device with multiple cores may be further designed to implement two microcontrollers. According to some embodiments, as shown in FIG. 2, respective independent peripherals devices, such as DMA, PMD, as well as memory, I/O ports for each core are integrated within the IC to form two separate microcontrollers within a single IC device. The IC may further comprise configurable shared resources for master and slave device. For example, the master may be provided with 64-128 Kbytes of program flash memory with ECC and 16K RAM. According to one embodiment, the slave may be equipped with 24 Kbytes of program RAM (PRAM) with ECC which may be volatile and 4K data memory RAM. Other configurations are possible. Message Boxes and FIFO (MSI) may be used to communicate between the master and slave cores. Other hardware functions can be implemented.

According to an embodiment as shown in FIG. 2, the slave processor subsystem is a program RAM based application accelerator. The slave core's programming will reside in the flash memory of the master processor. At some time following system start-up, the master processor under user control transfers the slave's programming image from the flash memory to slave's program RAM. Once the initialization of the slave is completed, the master enables the slave. The slave code is executed by the slave processor and its first task is to initialize its peripherals. Once the master and slave processors are operating, they may pass information, commands, and status to each other through the MSI module 107. The MSI module 107 provides a number of registers (mail boxes) by which information can be shared between the processors. Associated with the MSI registers is interrupt logic that are used as semaphores (flags) to gain the attention of the other processor when information is ready for transfer. There are many usage models for such an asymmetric dual core architecture: Customer generated functions may include small intensive computations (filters, PID); medium sized tasks (BLDC control); or large programs (BLDC Auto tuning). The intent for slave processor core is to act as an "Application Accelerator". The user determines which small portion of the application code needs to be accelerated. In many motor control and power control applications, a very small subset (a few K bytes) of the overall application program is run so often that it consumes the bulk (maybe 80%) of the processor's time. The application accelerator aids the partitioning of the application software into two blocks: a small control loop, and the larger general application (communications, safety checks, user interfaces, etc). Often the control software is developed by a different group of people than those that develop the general purpose and communications software. Having two processors aids the system integration of the "hard real time" control software with the larger but less time critical portions of the application. While the slave processor's program memory is RAM based, other embodiments may implement also flash memory (internal or external) for the slave processor(s). While the use of slave flash memory is costly, it can provide very high levels of security.

According to one embodiment, the master core as shown in FIG. 2 may implemented as a dsPIC processor core clocked by a 100 MHz system clock. The basic architecture of such a core is well known in the art and available from the assignee of the present application, Microchip Technology Inc. The second core may also be implemented as a dsPIC processor which runs at 120 MHz. The fact that the second core (slave) runs faster than the first core is based on the implementation of the program memory which is provided by a faster volatile random access memory whereas the first core runs from a non-volatile flash memory. However, other configurations are possible. While these cores each have their own peripherals, as shown in FIG. 2, certain features may be shared, such as oscillators, reset logic, brown-out reset module, voltage regulators, JTAG, etc. Furthermore, external pins may also be shared through a respective multiplex control logic (not shown). Ownership of the pins may be configurable.

Figure 3:
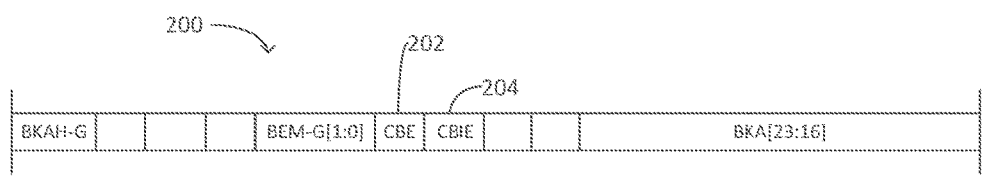
FIG. 3 illustrates exemplary breakpoint control logic in accordance with embodiments.

Turning now to FIG. 3, a diagram of an example breakpoint register is shown. Each core in the processing device may be associated with its own breakpoint register. The breakpoint register 200 includes a cross breakpoint enable (CBE) bit 202 and a cross breakpoint interrupt enable (CBIE) bit 204. Typically, a break-point register is provided for each breakpoint. As will be explained in greater detail below, a core will update the corresponding status register, including the cross breakpoint enable bit 202 or cross breakpoint interrupt enable bit 204 when a breakpoint is encountered to propagate the breakpoint to the respective other core. The cross breakpoint enable bit 202 is used in a simultaneous mode, in which multiple cores may be debugged simultaneously. The cross breakpoint interrupt enable bit 204 is used in a quasi-simultaneous mode, in which one core is debugged while the other runs code. In this case, an interrupt is triggered to cause the other to get debugged while the first core resumes running code.

In particular according to an embodiment, the CBE bit enables a break signal from the debug module of one processor core to be propagated to the debug module of the other processor's debug module. This allow a break condition on one processor to also break the other processor at approximately the same time. The CBIE bit, on the other hand, enables a break signal from the debug module of one processor core to be propagated to the interrupt controller of the other processor core. This allow a break condition on one processor to interrupt the other processor at approximately the same time. This feature is useful in control applications where the customer may not want to stop the other processor while it is in a control loop. A break interrupt allows for the collection of information at the time of a break event on the other processor. Respective status bits may be used to indicate that a break event request was received from the other processor.

Figure 4:
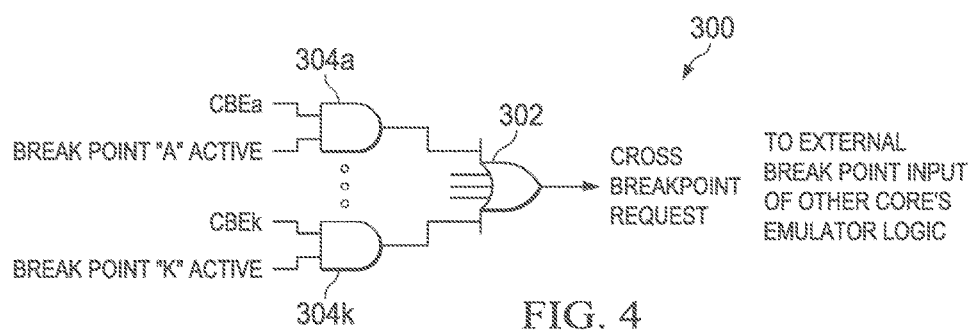
FIG. 4 illustrates exemplary breakpoint interrupt control logic in accordance with embodiments.

Shown in FIG. 4 shows a corresponding cross breakpoint request logic 300. Such logic may be an embodiment of logic 114, 115 of FIG. 1. The cross breakpoint enable logic may be employed in a mode allowing simultaneous debugging of multiple processors. In the embodiment illustrated, the logic includes OR gate 302 and AND gates 304a . . . 304k. Typically, one such AND gate is provided for each breakpoint. In operation, one input to each AND gate is the corresponding breakpoint status indicator, i.e., status flag. The other input is the cross break point enable bit 202 from the breakpoint register 200 (FIG. 3) which is set when the corresponding break point is activated. Thus, in operation, when a breakpoint is active, the core sets the corresponding cross breakpoint enable bit. This causes the output of the logic 300 to assert a cross breakpoint request, which is received at a breakpoint input (not shown) of the other core's emulator logic. It is noted that other, equivalent logic may be employed.

Figure 5:
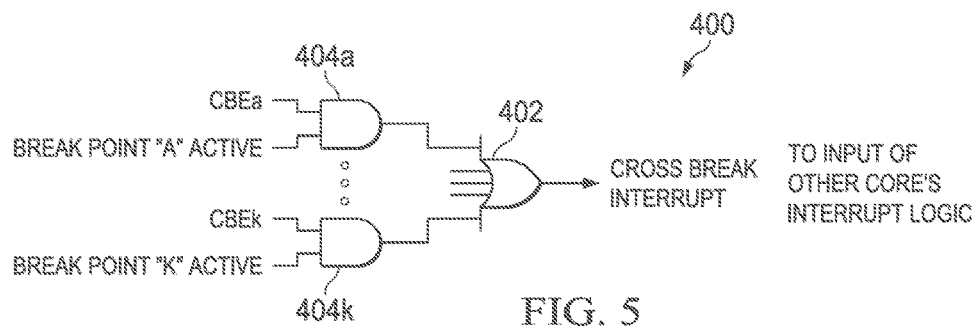
FIG. 5 is a diagram illustrating an exemplary breakpoint status register in accordance with embodiments.

Similarly, shown in FIG. 5 is cross breakpoint interrupt enable logic 400. Such logic may be an embodiment of logic 114, 115 of FIG. 1. Such cross breakpoint interrupt enable logic may be employed in a mode of quasi-simultaneous debugging, in which one of multiple processors is debugged while the others run application code. In the embodiment illustrated, the logic includes OR gate 402 and AND gates 404a-404k. Typically, one AND gate is provided for each breakpoint. In operation, one input to each AND gate is the corresponding breakpoint status indicator, i.e., status flag. The other input is the cross break point interrupt enable bit 204 from the breakpoint register 200 (FIG. 3) which is set when the corresponding break point is activated. Thus, in operation, when a breakpoint is active, the core sets the corresponding cross breakpoint interrupt enable bit. This causes the output of the logic 400 to assert a cross breakpoint interrupt request, which is received at the input of the other core's interrupt logic 107. Again, any suitable equivalent logic may be employed.

Figure 6:
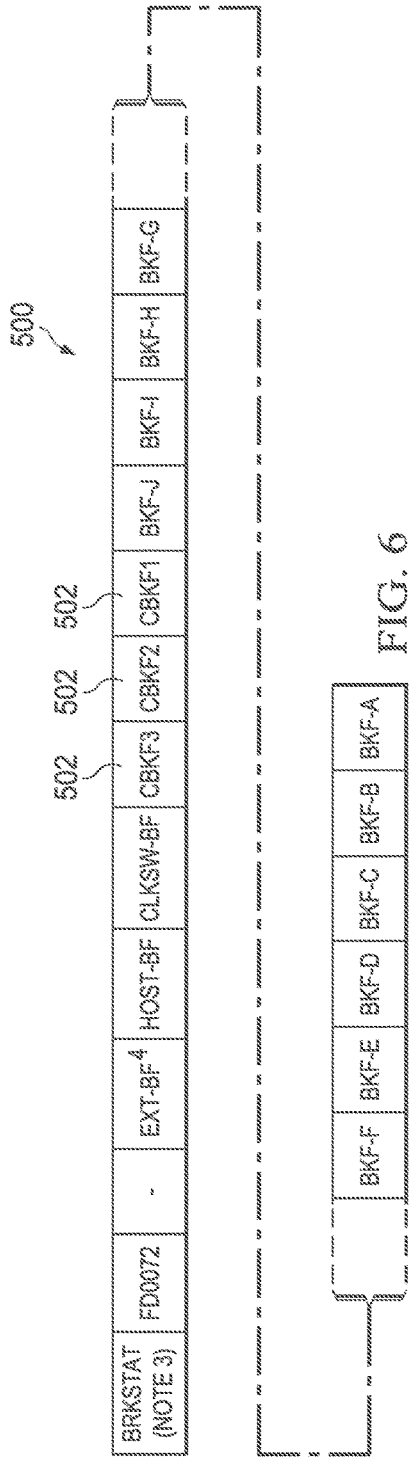
FIG. 6 illustrates an exemplary clock crossing circuit in accordance with embodiments.

In implementing the quasi-simultaneous mode, the processing devices interrupt controller is employed to assert interrupts at the corresponding core and set the core's interrupt status register. An example interrupt status register 500 is shown in FIG. 6. Each processor core's breakpoint status register 500 includes one or more interrupt status flags corresponding to the appropriate breakpoint interrupt and is set when the interrupt request is received.

Figure 7:
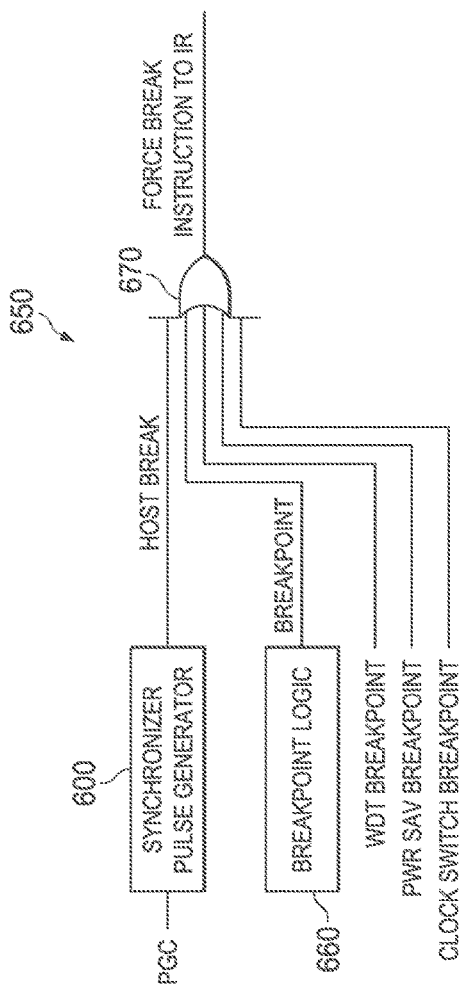
FIG. 7 illustrates an exemplary system for debugging a multicore processing device in accordance with embodiments.
Figure 8:
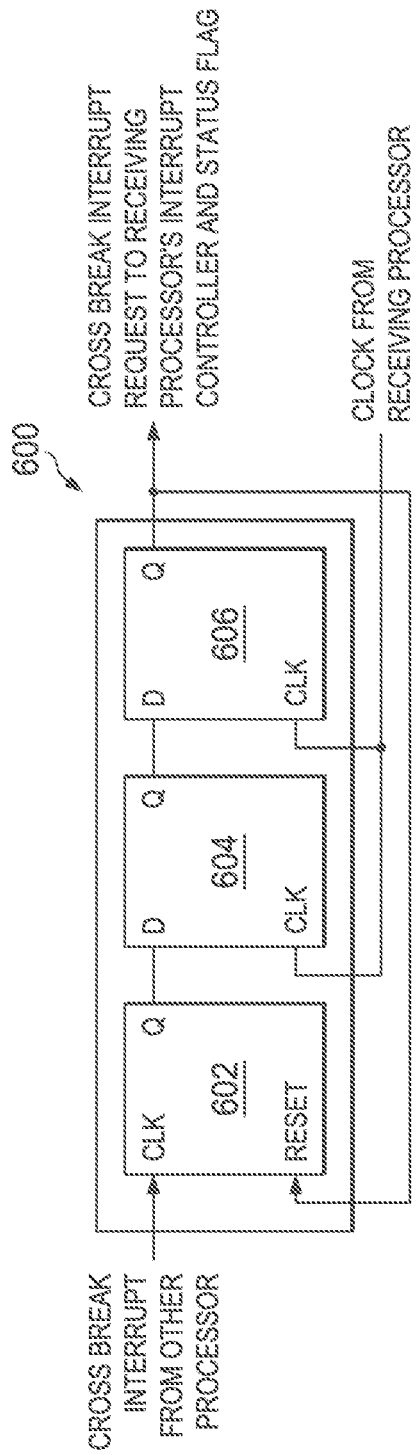
FIG. 8 illustrates an exemplary synchronizer pulse generator as used in the embodiment of FIG. 7.

FIG. 7 shows an example of a breakpoint interface 650 for each processing core. As shown various breakpoints can be generated and combined using an OR gate 670. For example, breakpoint logic 660 may be provided to generate a user breakpoint. Other peripheral devices, such as, for example, a watchdog peripheral, a power saving function, or a clock switching unit may generate separate breakpoints. Other units generating a breakpoint upon an internal or external event may be implemented. A synchronizer pulse generator 600 is used to forward signals from the other core. Such a synchronizer pulse generator 600 can be implemented by a corresponding clock crossing circuitry for the interrupt request is shown in FIG. 8. In particular, circuitry 600 includes flipflops 602, 604, 606. Flipflops 604, 606 are clocked by the receiving processor core's clock. The clock input of the flipflop 602 is provided from the requesting processor core's cross breakpoint interrupt (i.e., the output of cross breakpoint interrupt enable logic 400). The output of the circuitry 600 is fed back to the RESET input of the flipflop 602 and is output to the receiving processor's interrupt controller 107 (FIG. 1) and used to set the interrupt status flag 502 of the status register 500.

Figure 9:
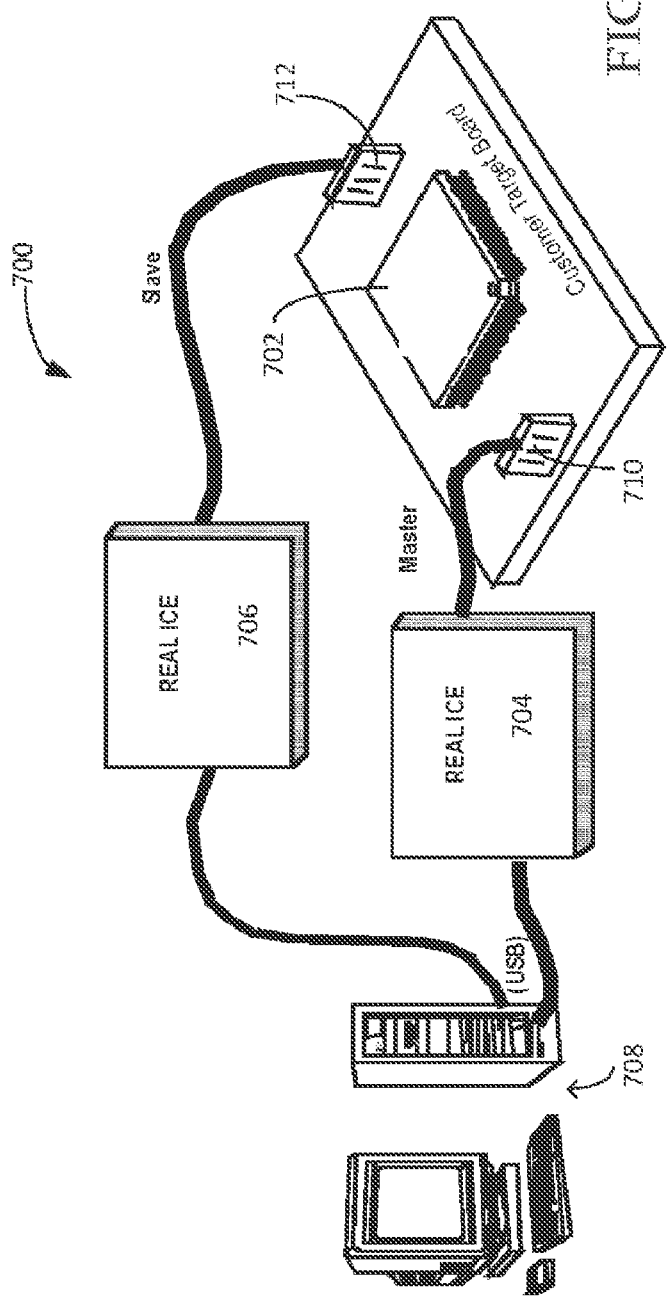
FIG. 9 shows a development system with two emulators and a target board.

Thus, various embodiments enable the user to debug a multi-core processing device, in particular an asymmetrical multi-core processing device having two cores running at different, in particular, independent system clocks. An example debugging environment 700 that may be used in conjunction with systems and methods herein is shown in FIG. 9. As shown, the environment 700 includes a target multi-core IC device 702 on a target board 703 that includes interfaces 710, 712 for leads to corresponding in circuit emulators (ICE) 704, 706. In embodiments in which a simultaneous debugging of more than one processor is desired, an ICE is provided for each processor. Thus, in the embodiment illustrated, up to two processing cores may be simultaneously debugged. The ICEs 704, 706 may be embodied as REAL ICE emulators, manufactured and distributed by the assignee of the present application, Microchip technologies Inc., though other types are possible. Each ICE 704, 706 couples to a computer 708, such as a personal computer, laptop computer, workstation, or other device running an integrated development environment (IDE), such as the MPLABX environment also available from the assignee of the present application.

Figure 10:
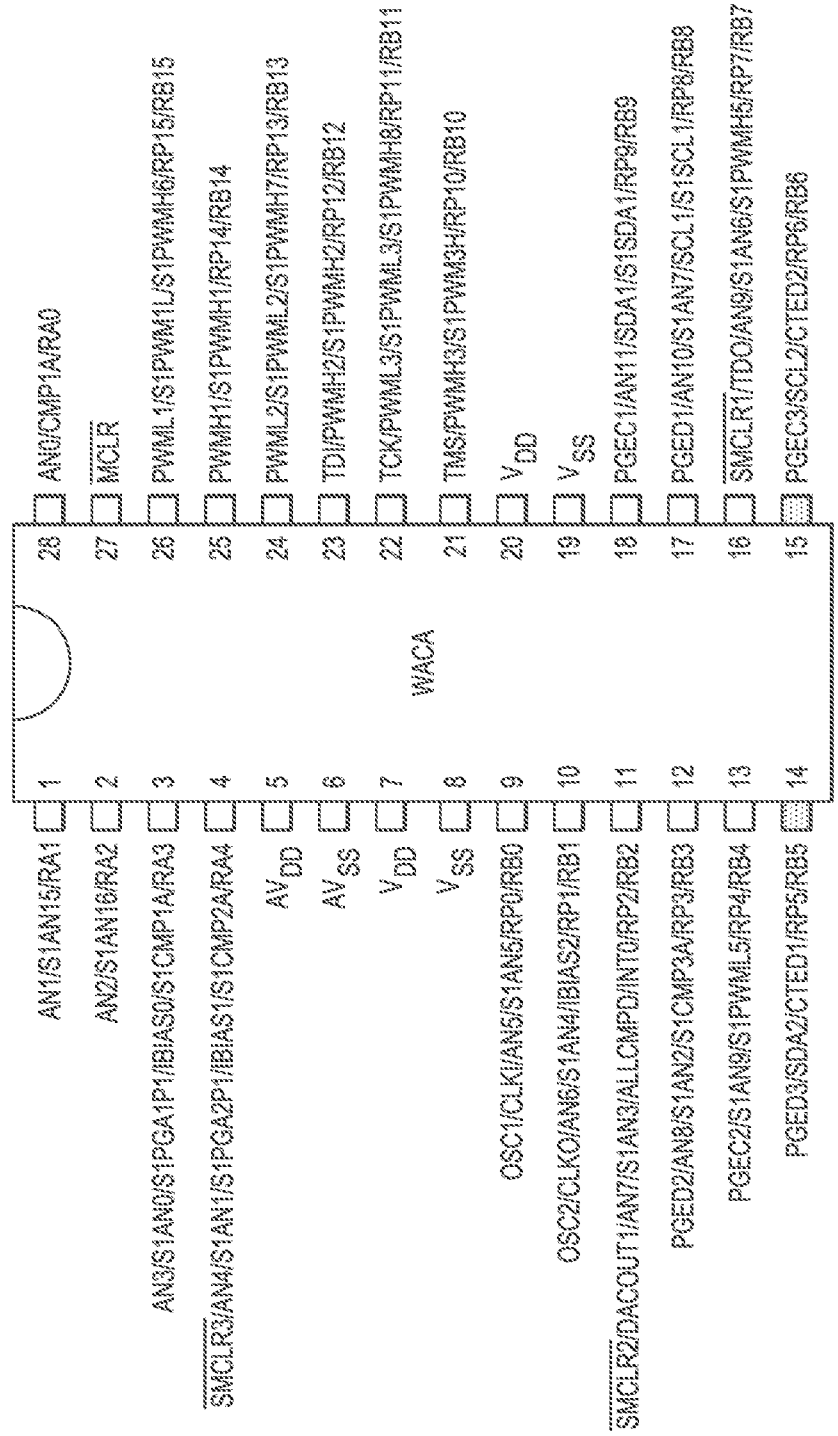
FIG. 10 shows a housing for an integrated circuit comprising a dual core microcontroller and its respective single function and multi-function pins.

FIG. 10 shows a possible pinout in an integrated circuit device having only 28 pins and two processing cores. Three sets of external pins PGECx and PGEDx and optionally SMCLRx provide a serial programming interface for the first and/or second processing core These serial interfaces are synchronous interfaces with a separate clock and data signal lines. The emulation system provides in circuit debugger capability. The ICD capability requires the use of the customer's functional pins. FIG. 9 shows the typical ICD connections. The processor cores are in the IC 702 on the customers target board. The IC 702 must dedicate a PGCx and a PGDx pin to support the debug of one processor at a time. To support simultaneous debug of two processors, the customers board must dedicate 2 PGCx and 2 PGDx pins, plus a another pin (SMCLRx) for the slave core as the interface to the REAL ICEs as shown in FIG. 10. Both the master and slave ICDs have their own configuration bits in flash memory (BKBUG and ICS[1:0]) in the FICD and SLVICD1 registers (respectively). To select their respective pairs of PGC/D pins, and the associated SMCLRx pin for the slave. Device power on reset and brown out reset POR/BOR will reset the master and force the slave into reset state until the SLVEN bit in a control register is set again by the master. A device MCLR will reset the master but not affect the slave according to an embodiment. The slave SMCLR will force the slave into reset state until the SLVEN bit is set again by master. The master run-time resets will not affect the slave. The slave run-time resets will reset the slave but not stop it.

As noted above, in some embodiments, multiple debugging modes may be available. These may include a Master core only mode; a Slave core only mode; a Simultaneous debugging mode; and a Quasi-simultaneous debugging mode.

In the Master core only mode, debugging is similar to debugging a conventional dsPIC or PIC MCU or any other microcontroller. In such a mode, typically, a single ICE circuit emulator 704 is coupled to the target board 703 and the host computer 708 running the IDE.

In the Slave core only mode, debugging is the same as a traditional dsPIC or MCU. Again, a single ICE emulator 706 is provided and is coupled to the target board and the computer 708 running the IDE.

In the Simultaneous mode, simultaneous debugging of both the master core 102 and the slave core 104 in the multicore device 702 are implemented. The cross core breakpoints stop (break) both cores at same time, as discussed above, in response to assertion of a cross breakpoint and enable bit. The debugging environment in this case includes both ICE 704, 706 (one for each processor core) and both again are coupled to the IDE running on a host computer 708.

The Quasi-Simultaneous master and slave debug mode functions to debug one or the other of the master or slave and keep other processor running application code. In this case, the cross-core breakpoint generates interrupts to other core in response to setting the cross breakpoint interrupt enable but in the corresponding status register. The debugging environment may include one or two ICEs. For example, the processor core generating the breakpoint interrupt that is fed to the other core may be connected with an ICE 704, while the other core may not need to be connected to an ICE. Instead, the other core may be coupled with the host through a serial or parallel interface to receive information generated in a respective interrupt service routine. According to another embodiment, the other core may also be coupled with an ICE 706 that comprises a trace interface which may receive the information generated in the debug interrupt service routine.

What is claimed is:

1. An integrated circuit device comprising a plurality of microcontrollers operating independently from each other, the integrated circuit further comprising:
   a first microcontroller of said plurality of microcontrollers comprising a first processor core, associated first program memory and first emulator logic for activating a first processor core breakpoint, the first microcontroller further comprising a plurality of first peripheral devices, wherein one of the first peripheral devices is a serial communication peripheral;

a breakpoint register within the first microcontroller and coupled with said first processor core for configuring a debugging breakpoint in the first processor core comprising at least one bit for enabling a cross breakpoint;

a second microcontroller of said plurality of microcontrollers comprising a second processor core communicatively coupled to the first processor core and including second emulator logic, wherein the second microcontroller comprises second program memory associated with the second processor core and a plurality of second peripheral devices, wherein one of the second peripheral devices is a serial communication peripheral; and a first cross breakpoint logic within the first emulator logic which, when said at least one bit is set, is configured to communicate a cross breakpoint signal by the first emulator logic at the first processor core to the second processor core thereby stopping execution of instructions in the second processor core.

2. A system comprising an integrated circuit device according to claim 1, further comprising:

a host computer coupled with an in-circuit emulator or debugger, wherein the in-circuit emulator or debugger is coupled with the first emulator logic of the first microcontroller and wherein the second microcontroller is coupled with the host computer through said second serial communication peripheral.

3. A system comprising an integrated circuit device according to claim 1, further comprising:

a host computer coupled with a first and second in-circuit emulator or debugger, wherein the first in-circuit emulator or debugger is coupled with the first emulator logic of the first microcontroller and wherein the second in-circuit emulator or debugger is coupled with the second emulator logic of the second microcontroller.

4. An integrated circuit device in accordance with claim 1, wherein the second emulator logic comprises a second cross breakpoint logic configured to communicate a breakpoint activated by the second emulator logic at the second processor core to the first processor core.

5. An integrated circuit device in accordance with claim 1, wherein the first cross breakpoint logic communicates the breakpoint as an interrupt request to an interrupt input associated with the second processor core.

6. An integrated circuit device in accordance with claim 5, wherein the break point register comprises one or more cross breakpoint interrupt enable bits operable to enable the first cross breakpoint logic to communicate the interrupt request to the interrupt input associated with the second processor core.

7. An integrated circuit device in accordance with claim 1, wherein each emulator logic comprises an interface coupled with a set of external pins.

8. An integrated circuit device in accordance with claim 7, wherein a first set of peripheral devices is integrated within the integrated circuit devices and coupled with the first processor core thereby forming a first microcontroller and a second set of peripheral devices is integrated within the integrated circuit device and coupled with the second processor core thereby forming a second microcontroller.

9. An integrated circuit device in accordance with claim 7, wherein the first microcontroller is operating as a master and the second microcontroller is operating as a slave.

10. An integrated circuit device in accordance with claim 8, wherein the first set of peripheral devices and/or the second set of peripheral devices comprises a serial communication peripheral.

11. An integrated circuit device in accordance with claim 1, wherein the first processor core is clocked by a first system clock and the second processor core is clocked by a second system clock which is different than the first system clock.

12. An integrated circuit device in accordance with claim 11, further comprising clock crossing circuitry interfacing the first cross breakpoint logic with the second processor core.

13. An integrated circuit device in accordance with claim 12, wherein the clock crossing circuitry is coupled between the first cross breakpoint logic and an interrupt controller associated with the second processor core.

14. An integrated circuit device in accordance with claim 1, wherein the first and/or second emulator logic is operable to configure a plurality of programmable breakpoints.

15. An integrated circuit device in accordance with claim 14, wherein said programmable breakpoints comprise instruction breakpoints and data breakpoints.

* * * * *